United States Patent
Hasegawa et al.

(10) Patent No.: US 7,729,198 B2
(45) Date of Patent: Jun. 1, 2010

(54) SYNCHRONOUS MEMORY CIRCUIT

(75) Inventors: Masatoshi Hasegawa, Hachioji (JP);
Michiaki Nakayama, Ome (JP);
Masatoshi Sakamoto, Hamura (JP)

(73) Assignee: Hitachi, Ltd., Tokyo (JP)

( * ) Notice: Subject to any disclaimer, the term of this patent is extended or adjusted under 35 U.S.C. 154(b) by 85 days.

(21) Appl. No.: 11/926,756

(22) Filed: Oct. 29, 2007

(65) Prior Publication Data

US 2008/0175091 A1 Jul. 24, 2008

(30) Foreign Application Priority Data

Oct. 30, 2006 (JP) .............................. 2006-293486

(51) Int. Cl.
*G11C 8/00* (2006.01)
(52) U.S. Cl. ............................ 365/233.18; 365/233.16; 365/233.17; 365/233.1
(58) Field of Classification Search ................................
365/233.16–233.19, 233.1, 233.13, 189.011, 365/230.03
See application file for complete search history.

(56) References Cited

U.S. PATENT DOCUMENTS

| 6,128,233 | A | 10/2000 | Yu et al. |
| 6,556,506 | B2 * | 4/2003 | Naven .................... 365/230.03 |
| 6,674,686 | B2 * | 1/2004 | Noh et al. ............... 365/233.13 |
| 6,999,376 | B2 * | 2/2006 | Roohparvar ............. 365/233.1 |
| 2001/0036116 | A1 | 11/2001 | Kubo et al. |

FOREIGN PATENT DOCUMENTS

| JP | 2000-90665 A | 3/2000 |
| JP | 2000-306379 A | 11/2000 |

* cited by examiner

*Primary Examiner*—David Lam
(74) *Attorney, Agent, or Firm*—Miles & Stockbridge P.C.

(57) ABSTRACT

A semiconductor integrated circuit device including a memory circuit with both high access efficiency and high memory efficiency in a simple configuration is provided. In a memory read control circuit, burst length is changed based on whether or not a read instruction is issued at a cycle after a cycle at which a read instruction /R is issued. And, in a memory write control circuit, burst length is changed based on whether or not a write instruction is issued at a cycle before a cycle at which a write instruction /W is issued.

4 Claims, 7 Drawing Sheets

Third cycle

FIG. 4B

Fourth cycle

FIG. 4C

Fifth cycle

FIG. 5A

First cycle

FIG. 5B

Second cycle

FIG. 5C

Third cycle

SYNCHRONOUS MEMORY CIRCUIT

CROSS-REFERENCE TO RELATED APPLICATION

The present application claims priority from Japanese Patent Application No. JP 2006-293486 filed on Oct. 30, 2006, the content of which is hereby incorporated by reference into this application.

TECHNICAL FIELD OF THE INVENTION

The present invention relates to a synchronous memory circuit.

BACKGROUND OF THE INVENTION

As a synchronous static RAM and the like, there is one in which burst length (number of bits of data written/read continuously) is changed for each product. And, as a synchronous dynamic RAM and the like, there is one in which the burst length is made variable by mode setting using a mode register set before write/read operation.

SUMMARY OF THE INVENTION

However, in each case, the burst length after start of the write/read operation is fixed. And therefore, in application handling data with various numbers of bits, there is a case in which only a part of burst data is used and efficiency of memory capacity is deteriorated.

As a result of research for known examples about memories with variable burst length carried out after the present invention has been made, an example described in Japanese Patent Application Laid-Open Publication No. 2000-90665 (Patent Document 1) has been found. The known example discloses a memory circuit having a dedicated instruction for changing burst length.

In a computer system such as a server, data is frequently processed by byte (1 byte=8 bits) and operation of writing to or reading from a memory is frequently performed by 8 bits or 4 bits, and therefore, the burst length is frequently set to 8 or 4. On the other hand, in a network system or the like, since length of data handled is random, if the burst length is excessively long, there is a case in which valid data in the burst is partial and the remaining data is invalid, as a result, efficiency of memory is deteriorated. If the burst length is set to be short in response, a region of invalid data described above is reduced, but it is necessary to issue a read instruction or a write instruction to the memory frequently, as a result, control is complicated and power consumption is increased. Furthermore, if a cycle of reception of a read instruction and a write instruction by the memory is longer than the burst length, it takes time to complete reading or writing of all data. It may be a factor blocking improvement of system performance.

In view of these circumstances, the present inventors have thought that, if the burst length of a memory can be changed freely, improvement of efficiency and performance and reduction in power consumption in memory can be achieved by changing the burst length according to length of data to be stored. To realize the achievement, a function for setting burst length by a mode register before writing or reading after power ON such as provided in a conventional synchronous dynamic RAM is insufficient. It is desirable that optimal burst length can be determined and selected according to length of data for each writing or reading.

An object of the present invention is to provide a semiconductor integrated circuit device provided with a memory circuit with burst length changeable for each reading or writing with simple structure. The above and other objects and novel characteristics of the present invention will be apparent from the description of this specification and the accompanying drawings.

The typical ones of the inventions disclosed in this application will be briefly described as follows. In a memory read control circuit, a control circuit changing the burst length of read data and a circuit for determining whether or not a read instruction is issued at a cycle after a cycle at which a read instruction is issued are provided. The burst length is changed by the control circuit according to the determination result. In a memory write control circuit, a control circuit changing the burst length of write data and a circuit for determining whether or not a write instruction is issued at a cycle before a cycle at which a write instruction is issued are provided. The burst length is changed by the control circuit according to the determination result.

The effects obtained by typical aspects of the present invention will be briefly described below. Since switching of the burst length can be performed when a read instruction or a write instruction is issued, both improvement of the efficiency of memory and simplification of control can be achieved. Especially, the synchronous memory circuit according to the present invention is effective in a system including many variations of data length.

DESCRIPTIONS OF THE PREFERRED EMBODIMENTS

Figure 1:
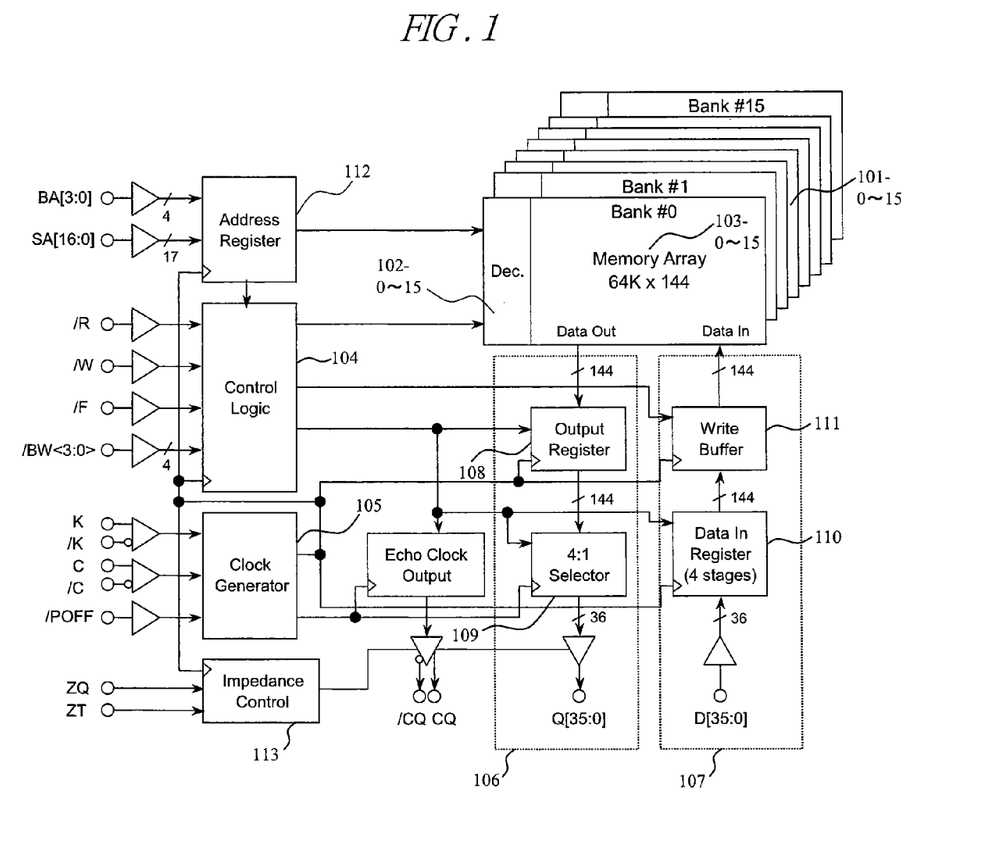
FIG. 1 is a circuit block diagram of a synchronous memory circuit.

FIG. 1 shows a function block diagram of a synchronous memory circuit mounted on a semiconductor integrated circuit device. A bank 101 which is a unit operable independently each other is composed of a decoder 102 and a memory array 103. In an example shown in FIG. 1, 16 banks (101-0 to 101-15) are mounted. For example, the memory array 103 is configured with 64K×144=9M bits composed of dynamic memory cells, and a whole memory circuit has memory capacity of 144M bits.

Note that, in one bank, from start of read or write operation to reach a state which can accept next instruction by terminating the operation, 5 cycles are consumed. However, since the banks 101-1 to 101-15 can operate independently, read instruction or write instruction can be received in each cycle as a synchronous memory circuit by selecting different banks.

Along with a clock supplied from a clock generating circuit 105, a read instruction signal /R, a write instruction signal /W, a data rate instruction signal /F, and another instruction are inputted into a control circuit 104 controlling the synchronous memory circuit, and various control signals are supplied to a read circuit 106 and a write circuit 107.

As shown in FIG. 1, the read circuit 106 and the write circuit 107 are provided commonly to a plurality of banks 101-1 to 101-15. The read circuit 106 and the write circuit 107 are provided independently of each other, and both a read instruction and a write instruction can be received at one cycle as a synchronous memory circuit. Note that, in this case, the read instruction and the write instruction must be issued for different banks. Since data buses are also divided into a read system Q[35:0] and a write system D[35:0], read operation and write operation can be performed simultaneously with reception of instruction. The read circuit 106 includes an output register 108 temporarily storing read data from the memory array 103 of the bank 101 and a selector 109 selectively outputting the read data stored in the output register 108 to the read system data bus. And, the write circuit 107 includes an input register 110 temporarily storing write data from the write system data bus and a write buffer 111 storing data to be written in the memory array 103 of the bank 101 designated by addresses (BA, SA) of the write data stored in the input register 110.

The write data is taken in at SDR (single data rate) or at DDR (double data rate) according to polarity of a date rate instruction signal /F. Though described in detail later, according to a burst length control signal (write) WRBL4T, serial-parallel conversion of 36:44 is performed when the burst length is 4, serial-parallel conversion of 36:72 is performed when the burst length is 2, and write operation to the memory array is conducted. And, read data is read from the memory array 103 by 144 bits for one instruction and parallel-serial conversion of 144:36 is performed. Though described in detail later, according to a burst length control signal (read) RDL4T, when the burst length is 4, read data corresponding to all of 144 bits is read using two cycles, on the other hand, when the burst length is 2, read data corresponding to only 72 bits is read from the memory circuit.

Note that, a part especially relating to the present invention has been mainly explained in the above, but other circuit blocks will be explained briefly below. An address register 112 stores a memory address to be accessed. The memory address is composed of a bank address BA and a synchronous address SA. The clock generating circuit 105 is composed of, for example, PLL, and includes two systems of basic clocks (K, /K) and output clocks (C, /C) in this configuration example. And, echo clocks (CQ, /CQ) are supplied to the outside of the synchronous memory circuit (see FIG. 6). Impedance control is performed to a clock (CQ, /CQ) driver and a driver to the read system data bus by an impedance control circuit 113.

Figure 2A:
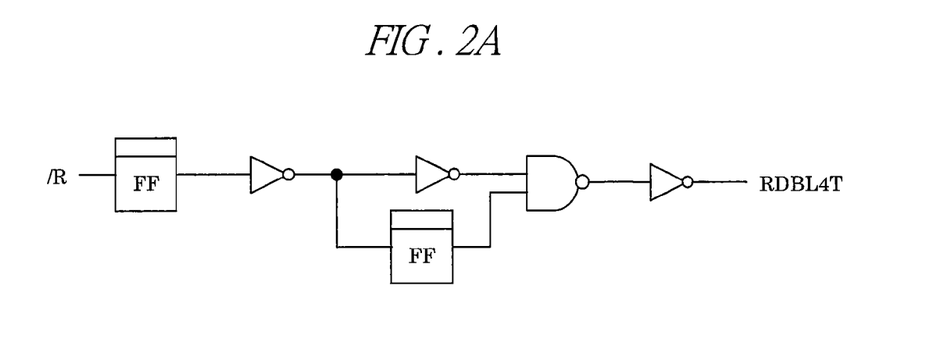
FIG. 2A is a diagram showing a configuration example of a burst length control circuit (read)
Figure 2B:
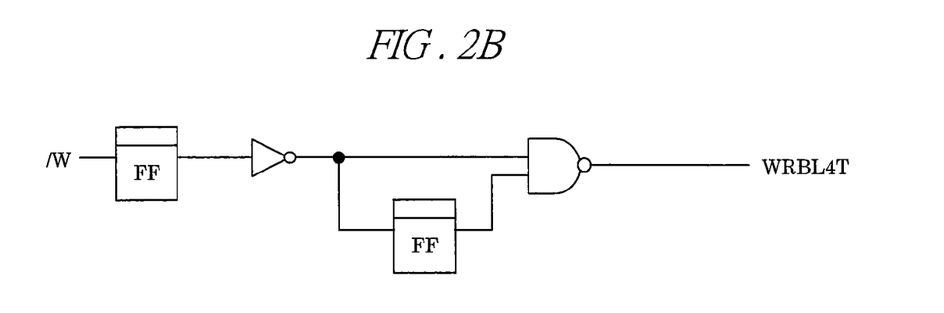
FIG. 2B is a diagram showing a configuration example of a burst length control circuit (write)
Figure 3:
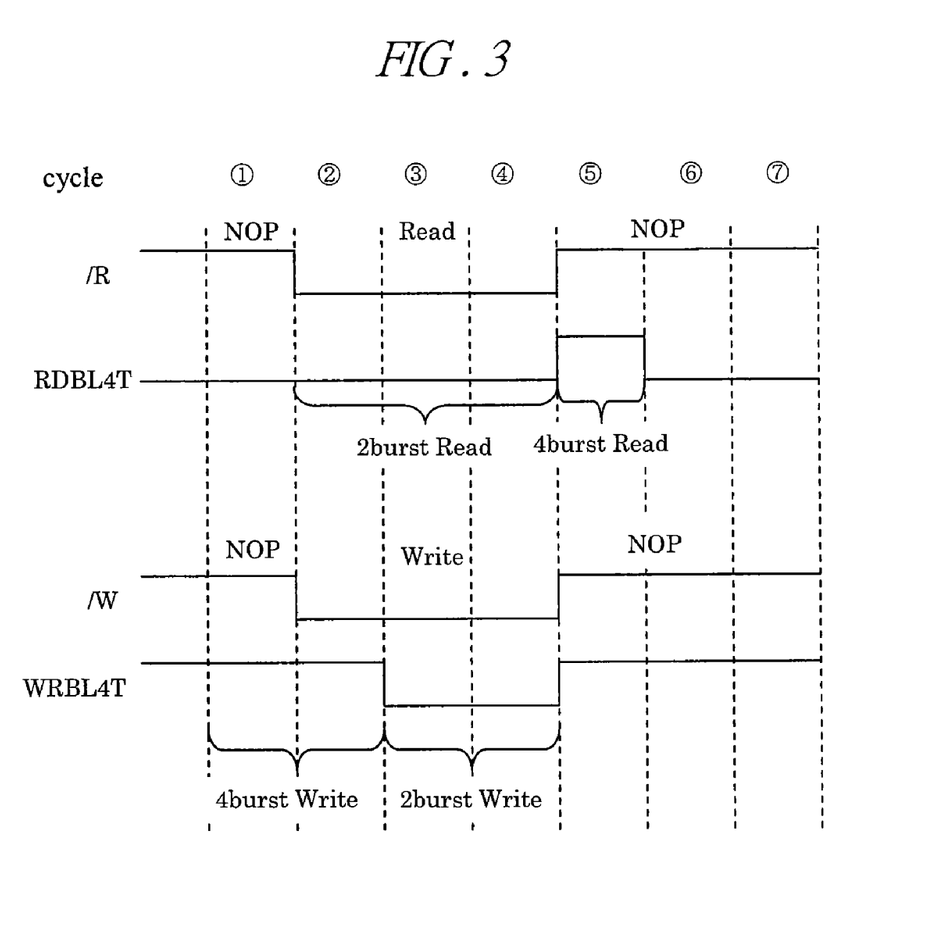
FIG. 3 is a timing chart of the burst length control circuits (read/write) shown in FIGS. 2A and 2B.

FIGS. 2A and 2B show configuration examples of burst length control circuits (read/write) generating burst length control signals (read/write) RDBL4T/WRBL4T, respectively. The burst length control circuits are included in the control circuit 104. And, FIG. 3 shows a timing chart of the burst length control signals (read/write) shown in FIGS. 2A and 2B.

First, operation of the burst length control circuit (read) will be explained. FIG. 3 shows a waveform of a burst length control signal (read) RDBL4T in the case where the read instruction signal /R is High at a first cycle, Low at a second to a fourth cycles and High again at a fifth cycle and later. Based on operation of the circuit shown in FIG. 2A, a waveform of the burst length control signal (read) RDBL4T having Low at the first to the fourth cycles, High at the fifth cycle and Low again at a sixth cycle and later is outputted. In this case, at the first cycle, the read instruction signal /R is High and read operation is not performed, that is, NOP (No Operation). At the second cycle, the read instruction signal /R is Low and read operation is performed. At the second cycle, the burst control signal (read) RDBL4T is Low and read operation of burst length 2 is performed. While the read instruction signal /R is continuously kept Low (the second to the fourth cycles), the read operation of burst length 2 continues, and when the read instruction signal /R becomes High (the fifth cycle), the burst length control signal (read) RDBL4T becomes High and read operation of burst length 4 is performed. Since the read instruction signal /R is High, read operation to new address is not performed, but data having not been outputted of read data corresponding to the previous address is outputted since the burst length becomes 4, as a result, the data bus is occupied.

Figure 4A:
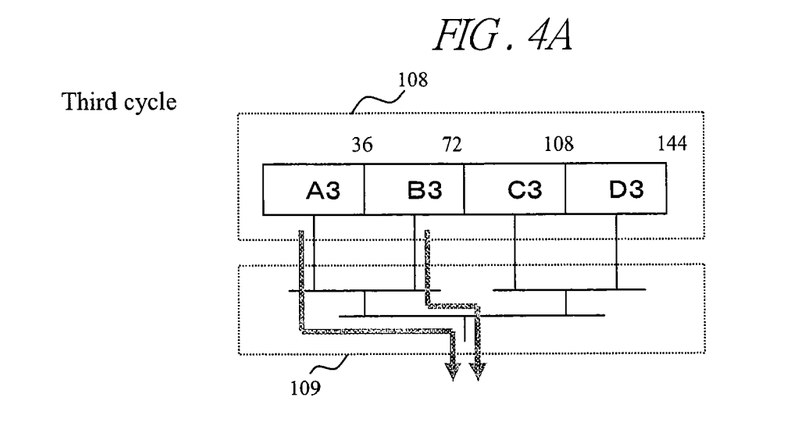
FIG. 4A is a diagram for explaining read operation in further detail.
Figure 4B:
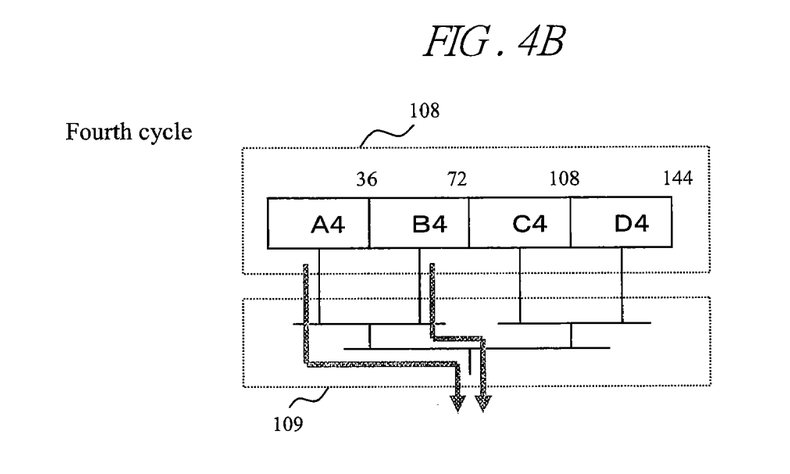
FIG. 4B is a diagram for explaining read operation in further detail.
Figure 4C:
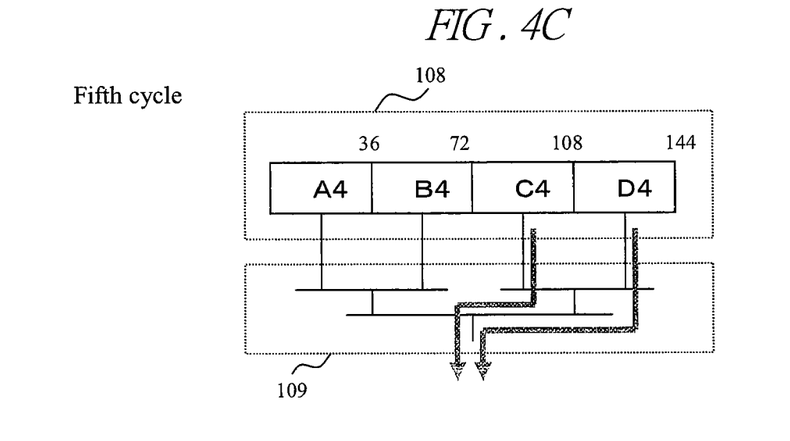
FIG. 4C is a diagram for explaining read operation in further detail.

The operation of the burst length control circuit (read) will be further explained using FIGS. 4A, 4B and 4C. The output register 108 has capacity of 144 bits in the configuration shown in FIG. 1, and the capacity is divided into four regions each having 36 bits. In a case of read of burst length 2, two regions are selected by the selector 109 and outputted to the read system data bus. Read data at the third to the fifth cycles shown in FIG. 3 will be explained in further detail. At the third cycle, upon reception of the read instruction signal /R (Low), A3 to D3 (each of A3 to D3 is read data of 36 bits) are read from the memory array and outputted to the output register 108 according to address signals (BA, SA). In the selector 109, since the burst length control signal (read) RDBL4T is Low, data of 72 bits which is read data (for example, A3 and B3) of two regions of the four regions is read and outputted to the data bus (the read of burst length 2). At the fourth cycle, upon reception of the read instruction signal /R (Low), A4 to D4 (each of A4 to D4 is read data of 36 bits) are newly read from the memory array and outputted to the output register 108 according to address signals (BA, SA). In the selector 109, since the burst length control signal (read) RDBL4T is Low, data of 72 bits which is read data (for example, A4 and B4) of two regions of the four regions is read and outputted to the data bus. Further, at the fifth cycle, upon reception of the read instruction signal /R (High), read from new memory array is not performed. Meanwhile, in the selector 109, since the burst length control signal (read) RDBL4T is High, data of 72 bits which is read data (C4 and D4 in the abovementioned example) of the remaining two regions is read and outputted to the data bus. And thereby, the read of burst length 4 is realized.

Next, operation of the burst length control circuit (write) will be explained. FIG. 3 shows a waveform of a burst length control signal (write) WRBL4T in a case where the write instruction signal /W is High at the first cycle, Low at the second to the fourth cycles and High again at the fifth cycle and later. Based on operation of the circuit shown in FIG. 2B, a waveform of the burst length control signal (write) WRBL4T having High at the first to the second cycles, Low at the third to the fourth cycles and High again at the fifth cycle and later is outputted. In this case, at the first cycle, the write instruction signal /W is High and write operation is not performed, that is, NOP (No Operation). At this time, write data is latched at each cycle so that the write operation can start whenever a write instruction is issued. When the write instruction signal /W becomes Low at the second cycle, the write operation is performed. At this time, the burst length control signal (write) WRBL4T is High and write operation of burst length 4 is performed. Further, when the write instruction signal /W is continuously kept in Low for at least two cycles, the burst length control signal (write) WRBL4T becomes Low (at the third and the fourth cycles) and write operation of burst length 2 is performed.

Figure 5A:
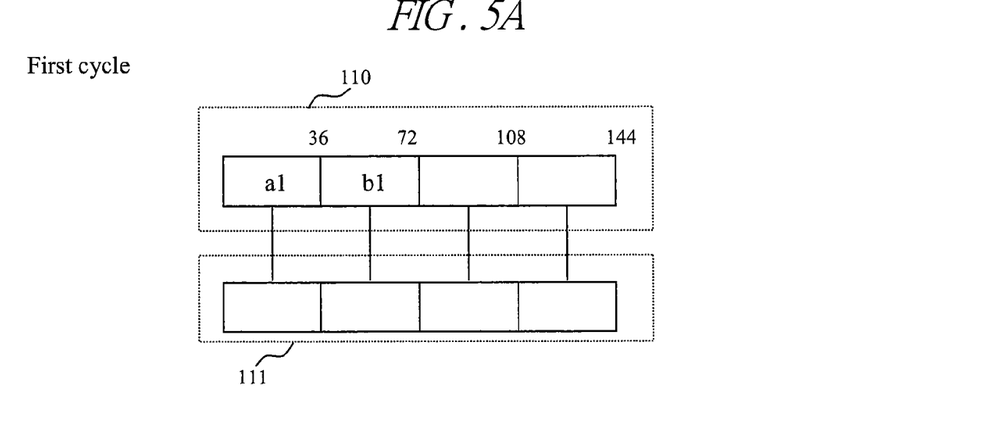
FIG. 5A is a diagram for explaining write operation in further detail.
Figure 5B:
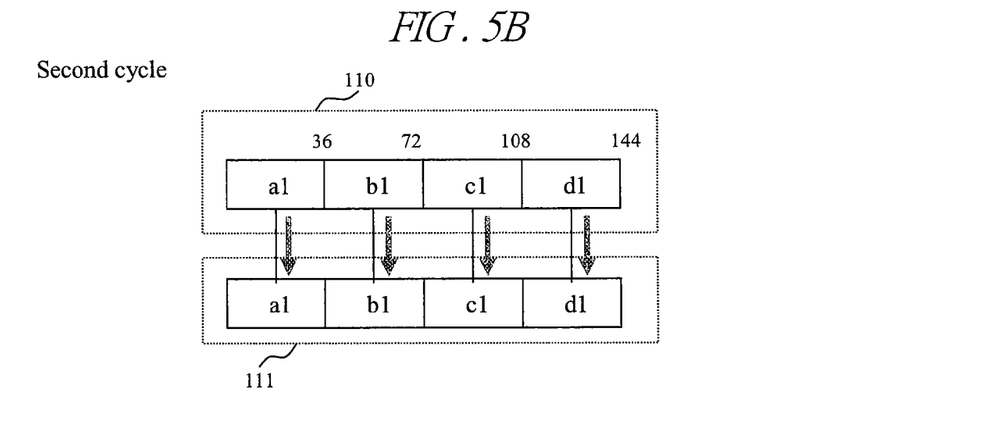
FIG. 5B is a diagram for explaining write operation in further detail.
Figure 5C:
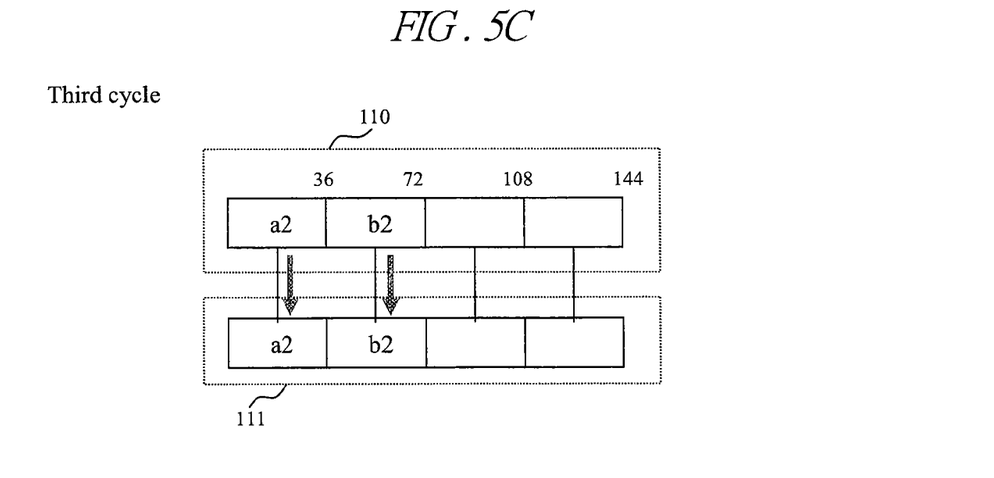
FIG. 5C is a diagram for explaining write operation in further detail.

The operation of the burst length control circuit (write) will be further explained using FIGS. 5A, 5B and 5C. The input register 110 has capacity of 144 bits in the configuration shown in FIG. 1, and the capacity is divided into four regions each having 36 bits. Write data at the first to the third cycles shown in FIG. 3 will be explained in further detail. At the first cycle, although the write instruction signal /W is High, write data a1 and b1 (each of a1 and b1 is write data of 36 bits) are latched. At the second cycle, the write instruction signal /W becomes Low. Since the burst length control signal (write) WRBL4T is High, write data c1 and d1 (each of c1 and d1 is write data of 36 bits) are latched, and 144 bits of write data a1 to d1 are transferred to the write buffer 111 and written in designated addresses (BA, SA) (write of burst length 4). Since the write instruction signal /W is Low and the burst length control signal (write) WRBL4T is Low at the third cycle, write data a2 and b2 are latched and 72 bits of the latched write data a2 and b2 are transferred to the write buffer 111 and written in designated addresses (BA, SA) (write of burst length 2). Switching of a range to be activated between 72 bits and 144 bits is performed according to input of the burst length control signal (write) WRBL4T into the write buffer 111.

Note that, in the present embodiment, since the burst length is switched between 2 and 4, while empty of the data bus occurs when NOP continues for two cycles or more, such a merit can be obtained that, even if the read NOP continues, data bus efficiency can be raised by extending the burst length to, for example, 8. However, if the burst length is excessively long, read or write operation to a new address cannot be performed during input or output of data, and system performance may be deteriorated, adversely. The burst length to be switched should be set to be advantageous for performance improvement of a system using the synchronous memory circuit of the present invention.

Figure 6:
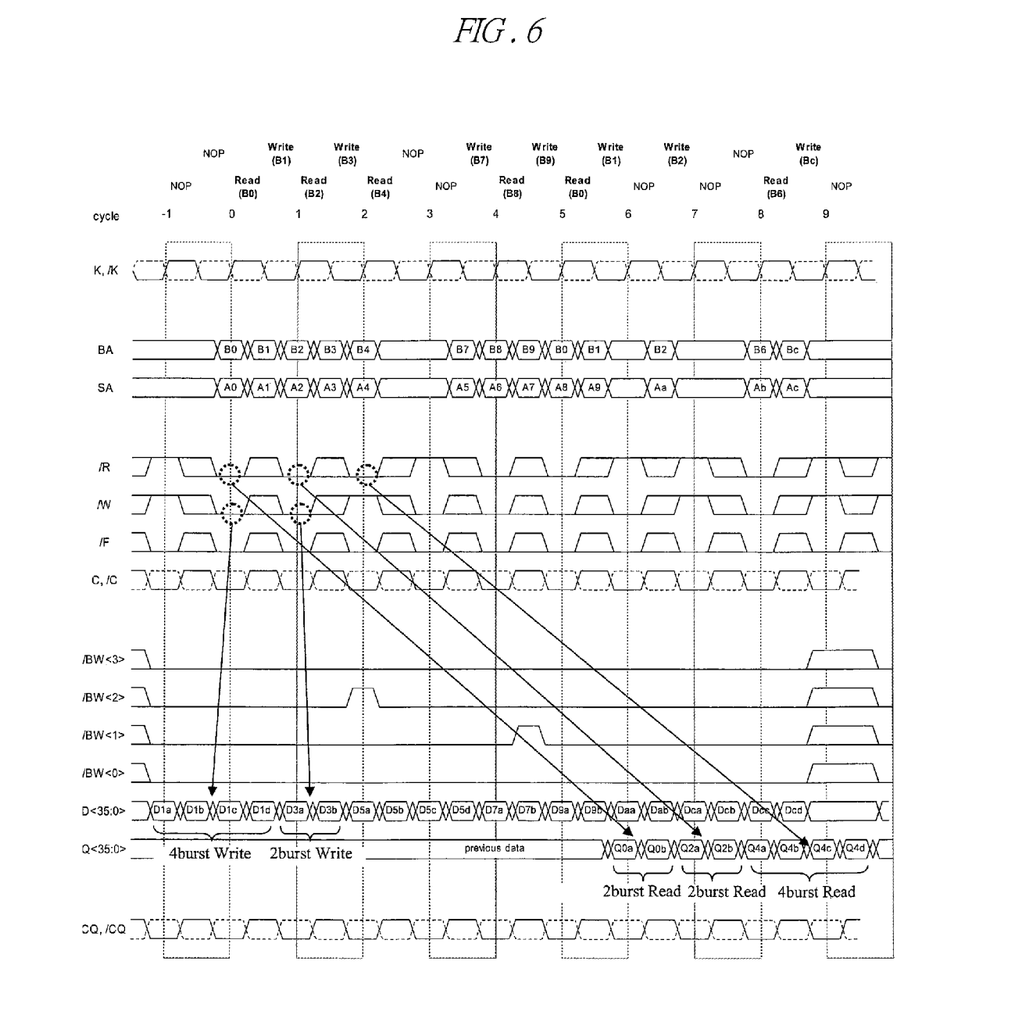
FIG. 6 is a timing chart of the synchronous memory circuit shown in FIG. 1.

FIG. 6 shows an example of a timing chart of the synchronous memory circuit shown in FIG. 1 in simultaneous read and write. In this period, a data rate instruction signal /F is Low and a timing chart of operation at DDR is shown. A read instruction signal /R becomes Low at a cycle #0. And therefore, a read instruction of bank address #B0 to address #A0 is issued. Read data corresponding to this read instruction is 2 bits (Q0a, Q0b) from the second half of a cycle #5 at DDR. Since the read instruction signal /R is Low and a read instruction is issued at cycle #1 also, the read data corresponding to the read instruction at the cycle #0 is only the abovementioned 2 bits (Q0a, Q0b) at burst length 2. Although a read instruction is issued to address #A4 of bank address #B4 at cycle #2, a read instruction is not issued at the next cycle #3, and therefore, the burst length becomes 4 and 4 bits (Q4a, Q4b, Q4c, Q4d) are read from the second half of a cycle #7 at DDR.

And, at the cycle #0, the write instruction signal /W is also low and a write instruction is issued to address #A1 of bank address #B1 issued at the second half of the cycle #0. Since the write instruction signal /W is High at the previous cycle #(−1), write operation of burst length 4 is performed and data of 4 bits (D1a, D1b, D1c, D1d) is written from the cycle #(−1) at DDR. Since the write instruction signal /W is Low at the next cycle #1 also, the burst length becomes 2 and data of 2 bits (D3a, D3b) is written from the cycle #1 at DDR.

Figure 7:
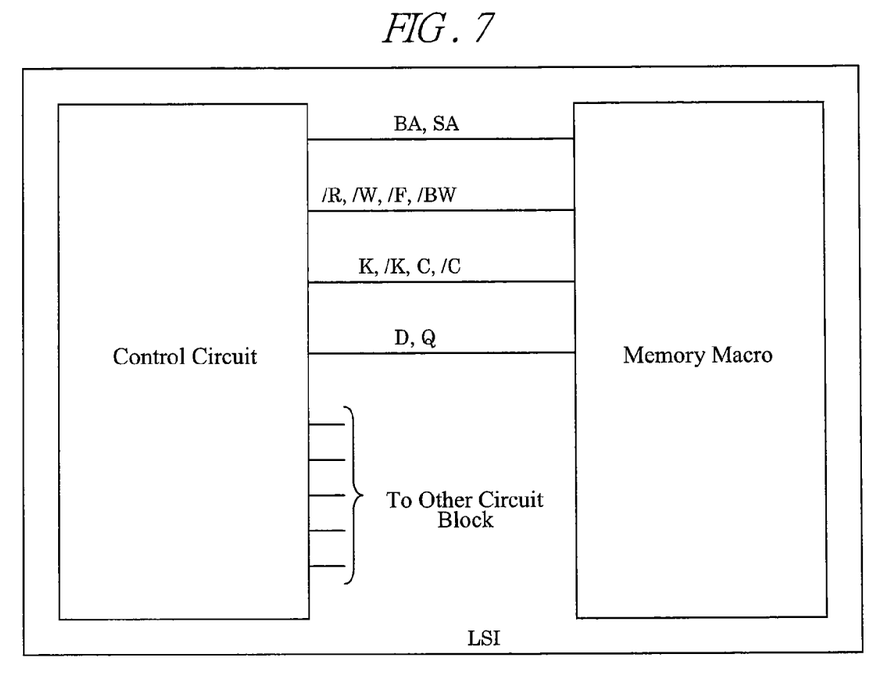
FIG. 7 is a diagram showing an example in which a memory macro according to the present invention is mounted on an LSI.
Figure 8:
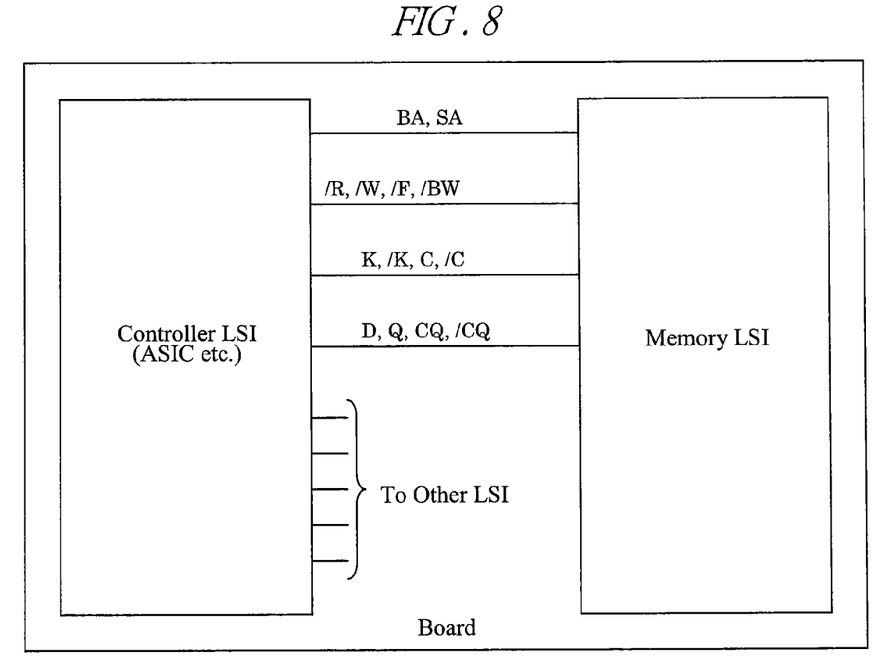
FIG. 8 is a diagram showing an example in which an integrated circuit device (memory LSI) according to the present invention is mounted on a board.

FIG. 7 shows an example in which a memory macro according to the present invention is mounted on an LSI. FIG. 8 shows an example in which an integrated circuit device according to the present invention is mounted on a board. In the example shown in FIG. 7, a control circuit and a memory macro corresponding to the configuration shown in FIG. 1 are integrated on one chip. In the example shown in FIG. 8, the control circuit shown in FIG. 7 is integrated on a controller LSI of one chip, a memory LSI corresponding to the configuration shown in FIG. 1 is integrated on one chip, and these plural chips are mounted on the board. In each case, a control signal (FIG. 7) from the control circuit to the memory macro or a control signal (FIG. 8) from the controller LSI to the memory LSI is a control signal required for basic read or write operation shown in FIGS. 3 to 6 and a signal instructing burst length is not provided.

What is claimed is:

1. A synchronous memory circuit comprising:
    a first control circuit changing a burst length of read data corresponding to a read instruction; and
    a second control circuit changing a burst length of write data based on a second write instruction being issued at a cycle before a cycle at which a first write instruction is issued,
    wherein the write data latched is written using a data transfer size that varies according to the burst length,
    wherein the second write instruction is issued at the same cycle as the first read instruction.
2. The synchronous memory circuit according to claim 1, wherein the burst length of write data corresponding to the first write instruction when the second write instruction is issued is shorter than the burst length of write data corresponding to the first write instruction when the second write instruction is not issued.
3. The synchronous memory circuit according to claim 1, wherein a read instruction can be issued at the same cycle as the first write instruction or the second write instruction.
4. The synchronous memory circuit according to claim 3 comprising:
    a plurality of banks,
    wherein the first write instruction, the second write instruction, and the read instruction each operate different respective banks.

* * * * *